United States Patent
Iwai

(10) Patent No.: US 12,212,132 B2
(45) Date of Patent: Jan. 28, 2025

(54) OVERCURRENT PROTECTION CIRCUIT FOR PROTECTING OVERCURRENT FLOWING THROUGH SWITCHING ELEMENT AND SWITCHING CIRCUIT WITH THE OVERCURENT PROTECTION CIRCUIT

(71) Applicant: OMRON Corporation, Kyoto (JP)

(72) Inventor: Satoshi Iwai, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 219 days.

(21) Appl. No.: 17/637,910

(22) PCT Filed: Sep. 12, 2019

(86) PCT No.: PCT/JP2019/035893
§ 371 (c)(1),
(2) Date: Feb. 24, 2022

(87) PCT Pub. No.: WO2021/048973
PCT Pub. Date: Mar. 18, 2021

(65) Prior Publication Data
US 2022/0278522 A1  Sep. 1, 2022

(51) Int. Cl.
*H02H 7/12* (2006.01)
*H02M 1/08* (2006.01)
(Continued)

(52) U.S. Cl.
CPC ............... *H02H 7/12* (2013.01); *H02M 1/08* (2013.01); *H02M 7/5387* (2013.01); *H03K 17/08104* (2013.01); *H02M 3/155* (2013.01)

(58) Field of Classification Search
CPC ........ H02H 7/12; H02M 1/08; H02M 7/5387; H02M 3/155; H02M 3/156; H02M 3/158;
(Continued)

(56) References Cited

U.S. PATENT DOCUMENTS

2007/0058307 A1*  3/2007  Mergens ............. H01L 27/0262
                                                    257/E29.225
2008/0074819 A1  3/2008  Sasaki et al.
(Continued)

FOREIGN PATENT DOCUMENTS

JP  2006014402 A  1/2006
JP  2012080488 A  4/2012
(Continued)

OTHER PUBLICATIONS

International Search Report for International Application No. PCT/JP2019/035893; Date of Mailing, Nov. 12, 2019.
(Continued)

*Primary Examiner* — Thienvu V Tran
*Assistant Examiner* — Sreeya Sreevatsa
(74) *Attorney, Agent, or Firm* — CANTOR COLBURN LLP

(57) ABSTRACT

An overcurrent protection circuit is provided for protecting an overcurrent flowing through a switching element that is controlled to be turned on and off based on a drive signal. The overcurrent protection circuit includes: a first transistor that is an N-channel field effect transistor (FET) having a drain connected to a control terminal of the switching element and a grounded source; a second transistor that is a PNP bipolar transistor having an emitter connected to the control terminal of the switching element, a collector connected to a gate of the first transistor and grounded via a first capacitor, and a base pulled up to a predetermined pull-up voltage; and a ground circuit connected in parallel with the first capacitor.

13 Claims, 12 Drawing Sheets

(51) Int. Cl.
*H02M 3/155* (2006.01)
*H02M 7/5387* (2007.01)
*H03K 17/081* (2006.01)

(58) Field of Classification Search
CPC .............. H02M 1/32; H03K 17/08104; H03K 17/08122; H03K 17/687
USPC ........................................................ 361/101
See application file for complete search history.

(56) References Cited

U.S. PATENT DOCUMENTS

2011/0075307 A1* 3/2011 Murota ................... H02H 3/093
361/57
2015/0263514 A1* 9/2015 Koishi ............... H03K 17/0828
361/93.7

FOREIGN PATENT DOCUMENTS

| JP | 2012186605 A | 9/2012 | |
|---|---|---|---|
| JP | 2014187543 A | 10/2014 | |
| JP | 2018057105 A | 4/2018 | |
| WO | WO-2016114416 A1 * | 7/2016 | ............. H03K 17/08 |

OTHER PUBLICATIONS

PCT Written Opinion of the International Searching Authority for International Application No. PCT/JP2019/035893, Date of Mailing, Nov. 12, 2019.
EPO Extended European Search Report for corresponding EP Application No. 19944776.4; Issued on Apr. 14, 2023.

* cited by examiner

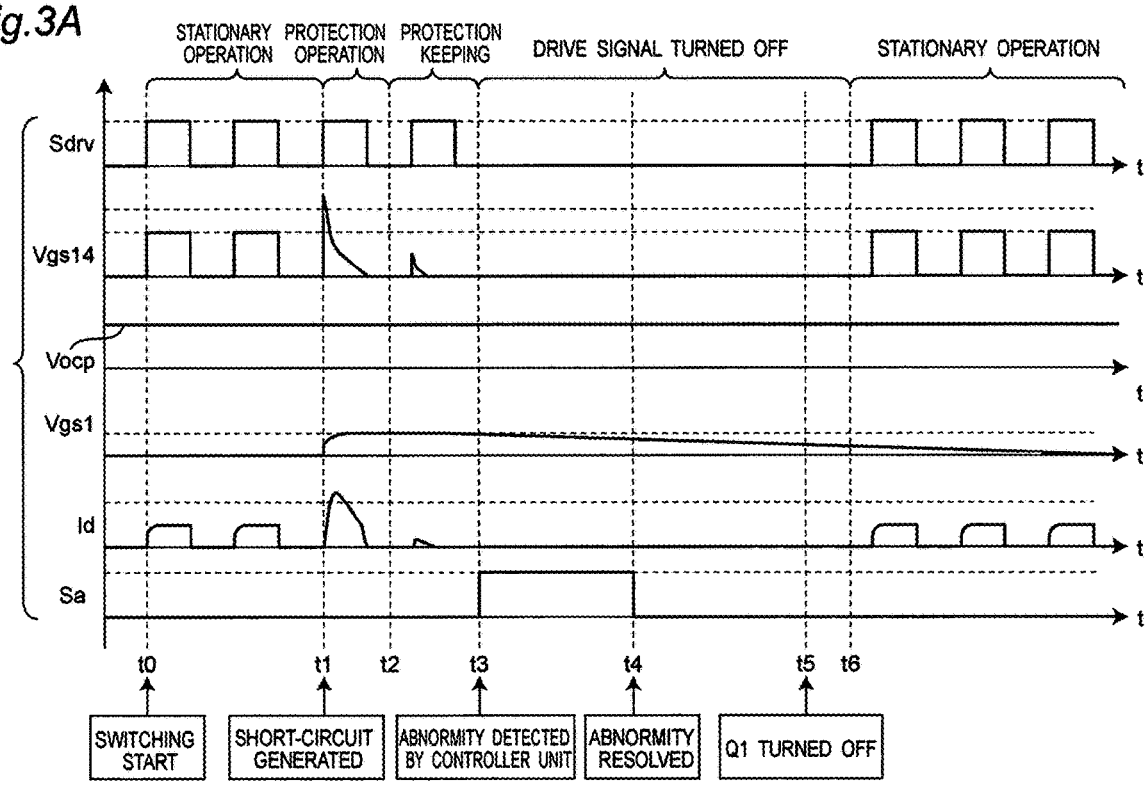

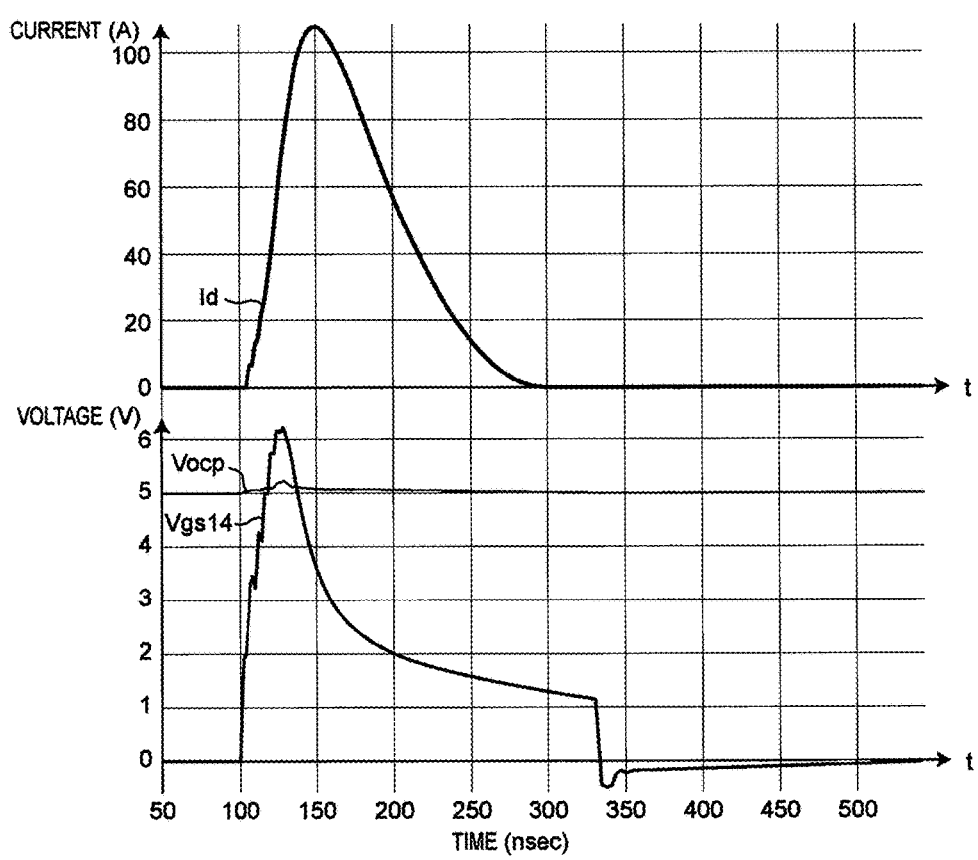

OVERCURRENT PROTECTION CIRCUIT FOR PROTECTING OVERCURRENT FLOWING THROUGH SWITCHING ELEMENT AND SWITCHING CIRCUIT WITH THE OVERCURENT PROTECTION CIRCUIT

CROSS REFERENCE TO RELATED APPLICATIONS

This is the U.S. national stage of application No. PCT/JP2019/035893, filed on Sep. 12, 2019. Priority is claimed herewith and the disclosure of which is also incorporated herein by reference.

TECHNICAL FIELD

The present invention relates to an overcurrent protection circuit and a switching circuit. In this case, the switching circuit is, for example, a switching circuit such as a boost chopper circuit, a half-bridge inverter circuit, or a full-bridge inverter circuit.

BACKGROUND ART

A semiconductor device generally has a short circuit tolerance, and when a current exceeding the short circuit tolerance flows, the semiconductor device may be broken. Overcurrent protection of the semiconductor device can be performed by quickly detecting an overcurrent flowing through the semiconductor device due to a short circuit and stopping the current flowing through the semiconductor device.

For example, Patent Document 1 provides an overcurrent protector for a power converter, in which the overcurrent protector can change a set level of a detection voltage of collector short-circuit detection at an optional timing even when a direct current (DC) voltage is high, low, or a constant, and can reliably protect a voltage drive element from the overcurrent.

The overcurrent protector according to Patent Document 1 includes:

the power converter having a voltage-driven power switching element;

an overcurrent detection section that detects a voltage of an input-side main terminal of the power switching element and applies an off signal to the power switching element when the voltage exceeds a predetermined value; and an overcurrent setting section that can be connected to the overcurrent detection section in a parallel relationship at an optional timing and can change the predetermined value.

A GaN device is a semiconductor device using gallium nitride (GaN), and has such a feature that the semiconductor device can be driven at a higher frequency than that of a conventional semiconductor device such as an insulated gate bipolar transistor (IGBT) and a silicon carbide (SiC) device.

PRIOR ART DOCUMENT

Patent Document

[Patent Document 1] Japanese Patent Laid-open Publication No. JP2006-14402A

SUMMARY OF THE INVENTION

Problems to be Solved by the Invention

However, the GaN device is weaker in overcurrent than the conventional semiconductor device, and there is a possibility of being broken by the overcurrent time of, for example, about 100 nanoseconds. Therefore, the conventional overcurrent protection techniques such as desaturation (DESAT) detection, current transformer (CT) detection, or the technique of Patent Document 1 cannot sufficiently protect the GaN devices.

An object of the present invention is to solve the above problems and to provide an overcurrent protection circuit and a switching circuit that can protect a semiconductor switch from the overcurrent more quickly than the prior art.

Means for Solving the Problems

According to one aspect of the present invention, there is provided an overcurrent protection circuit for protecting an overcurrent flowing through a switching element that is controlled to be turned on and off based on a drive signal. The overcurrent protection circuit includes: a first transistor that is an N-channel field effect transistor (FET) having a drain connected to a control terminal of the switching element and a grounded source; a second transistor that is a PNP bipolar transistor having an emitter connected to the control terminal of the switching element, a collector connected to a gate of the first transistor and grounded via a first capacitor, and a base pulled up to a predetermined pull-up voltage; and a ground circuit connected in parallel with the first capacitor.

Effect of the Invention

According to the overcurrent protection circuit according to the present invention, the semiconductor device can be protected from the overcurrent more quickly than the prior art.

BRIEF DESCRIPTION OF THE DRAWINGS

FIG. 3A is a timing chart illustrating operation waveforms of signals and the like in the current-driven switching circuit 10 in FIG. 1.

FIG. 3B is a timing chart illustrating a simulation result of the current-driven switching circuit 10 in FIG. 1 and illustrating operation waveforms of the current and voltage thereof.

MODE FOR CARRYING OUT THE INVENTION

Hereinafter, embodiments according to the present invention are described with reference to the drawings. However, each of the embodiments described below is merely an example of the present invention in all respects. It goes without saying that various improvements and modifications can be made without departing from the scope of the present invention. That is, in carrying out the present invention, specific configurations according to the embodiments may be appropriately adopted.

First Embodiment

Figure 1:
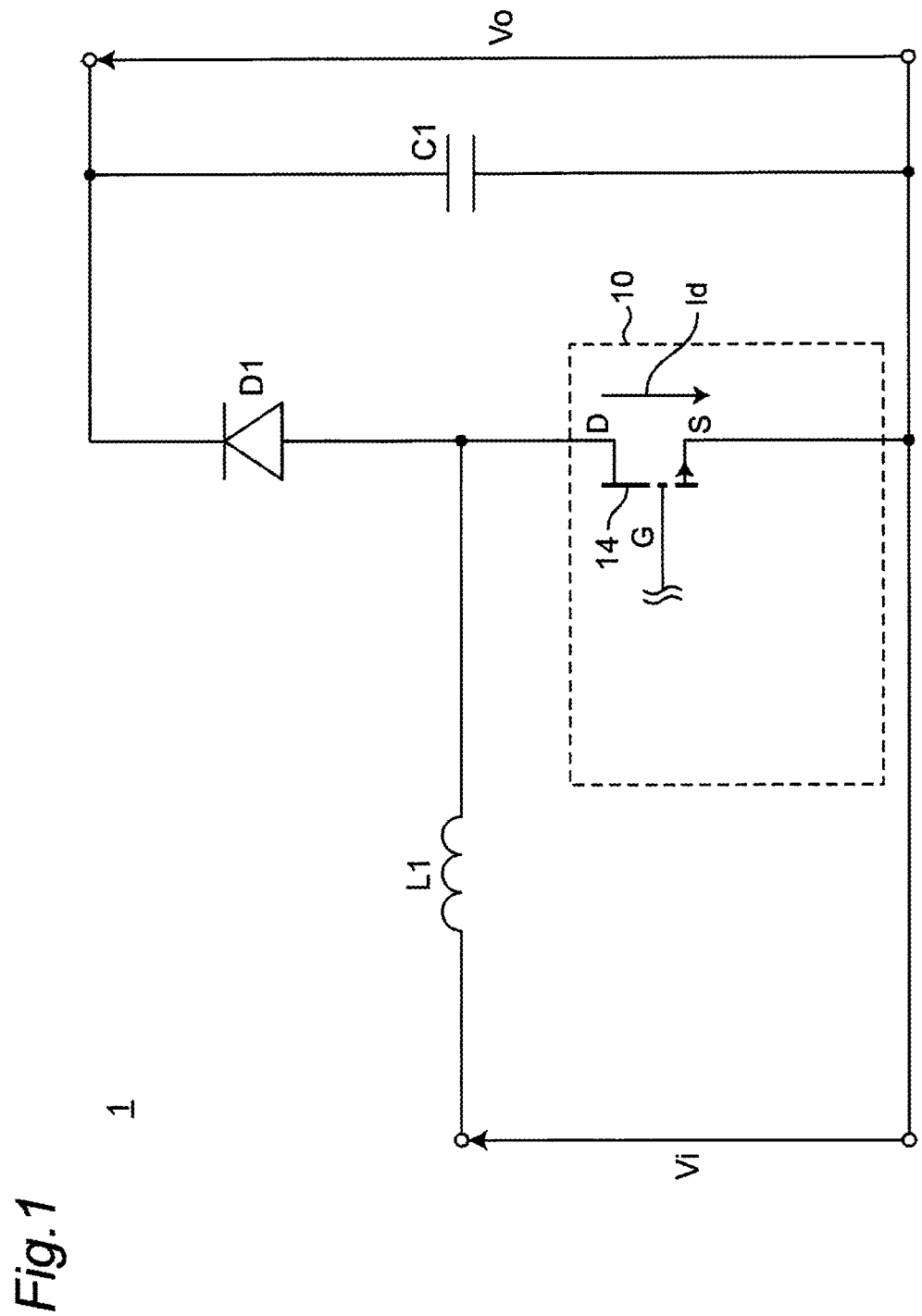
FIG. 1 is a block diagram illustrating a configuration example of a boost chopper circuit 1 according to a first embodiment.

FIG. 1 is a block diagram illustrating a configuration example of a boost chopper circuit 1 according to a first embodiment. Referring to FIG. 1, the boost chopper circuit 1 includes a current-driven switching circuit 10 having a semiconductor switch 14 of a switching element, an inductor L1, a diode D1, and a capacitor C1.

Referring to FIG. 1, an input voltage Vi is applied to the connection point of the anode of the diode D1 and the drain of the semiconductor switch 14 via the inductor L1. The source of the semiconductor switch 14 is grounded. The cathode of the diode D1 is connected to one end of the capacitor C1 that outputs an output voltage Vo, and the other end of the capacitor is grounded. A switching drive signal (hereinafter, referred to as a drive signal) for the boost chopper is inputted to the gate of the semiconductor switch 14, and the semiconductor switch 14 is switched to be turned on or off.

In the boost chopper circuit 1 configured as described above, the inductor L1 generates electromotive force in a direction that prevents a change in current. Therefore, when the semiconductor switch 14 is switched from on to off, the inductor L1 generates electromotive force in the same direction as the input voltage Vi so as to prevent the current from decreasing by the resistance of the diode D1. As a result, a voltage higher than the input voltage Vi is generated, and the voltage is smoothed by the capacitor C1 and converted into the output voltage Vo. Therefore, by periodically and selectively switching on and off of the semiconductor switch 14, the boost chopper circuit 1 converts the input voltage Vi into the DC output voltage Vo higher than the input voltage Vi and outputs the DC output voltage Vo.

As is described in detail later with reference to FIG. 2A and FIG. 2B, the current-driven switching circuit 10 of the boost chopper circuit 1 includes an overcurrent protection circuit 11 that turns off the semiconductor switch 14 and cuts off the overcurrent by grounding the gate of the semiconductor switch 14 in order to protect the semiconductor switch 14 from breaking due to a drain current Id that is the overcurrent of a predetermined value or more from flowing between the drain and the source of the semiconductor switch 14.

Figure 2A:
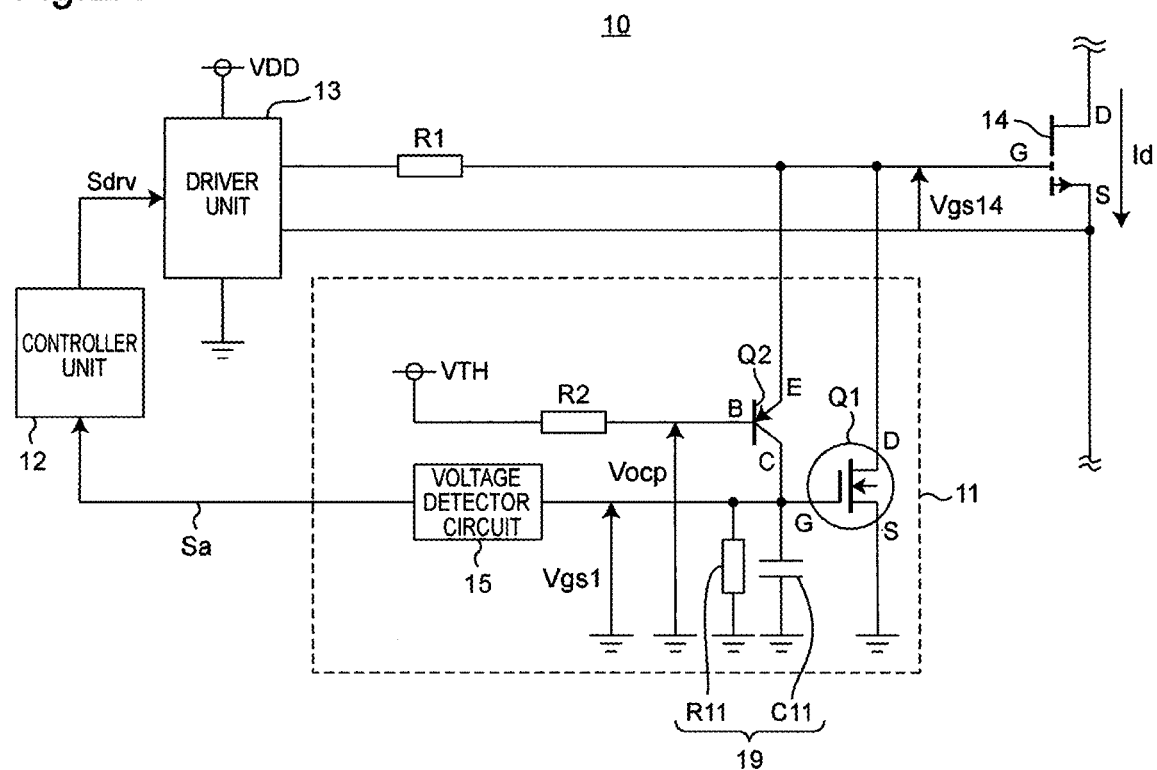
FIG. 2A is a block diagram illustrating a detailed configuration example of a current-driven switching circuit 10 in FIG. 1.

FIG. 2A is a block diagram illustrating a detailed configuration example of the current-driven switching circuit 10 in FIG. 1. Referring to FIG. 2A, the current-driven switching circuit 10 includes the overcurrent protection circuit 11, a controller unit 12, a drive unit 13, the semiconductor switch 14, and a resistor R1. The overcurrent protection circuit 11 includes transistors Q1 and Q2, a pull-up resistor R2, a voltage detector circuit 15, a capacitor C11, and a resistor R11. In this case, the overcurrent protection circuit 11 turns off the semiconductor switch 14 and cuts off the overcurrent by grounding the gate of the semiconductor switch 14 in order to protect the semiconductor switch 14 from breaking due to the drain current Id that is the overcurrent of a predetermined value or more from flowing between the drain and the source of the semiconductor switch 14.

Referring to FIG. 2A, the controller unit 12 controls the drive unit 13 by a drive signal Sdrv that is a pulse signal. In addition, the voltage detector circuit 15 monitors a detection voltage Vgs1 to be inputted, and outputs an abnormality detection signal Sa of the high level to the controller unit 12 when the detection voltage Vgs1 becomes a predetermined threshold value or more. In response to this, the controller unit 12 fixes the drive signal Sdrv to the low level and stops the drive unit 13. Note that a base voltage of the transistor Q2 is denoted as Vocp.

The drive unit 13 applies a gate-source voltage Vgs14 to the gate of the semiconductor switch 14 via the resistor R1 based on the drive signal Sdrv from the controller unit 12, and controls the semiconductor switch 14 to be turned on and off. The semiconductor switch 14 is, for example, a switching element such as a GaN device, and is controlled to be turned and off by the drive unit 13 to selectively switch whether or not to conduct the drain current Id.

In the overcurrent protection circuit 11, the transistor Q1 is, for example, an N-channel field effect transistor (FET). The drain of the transistor Q1 is connected to the gate-source voltage Vgs14, the source of the transistor Q1 is grounded, and the gate of the transistor Q1 is connected to the collector of the transistor Q2. In addition, the transistor Q2 is, for example, a PNP bipolar transistor, the emitter of the transistor Q2 is connected to the gate-source voltage Vgs14, the collector of the transistor Q2 is grounded via a time constant circuit 19 which is a parallel circuit of the capacitor C11 and the resistor R11, and the base of the transistor Q2 is pulled up to a threshold voltage VTH via the pull-up resistor R2. In this case, the time constant circuit 19 is provided to discharge a gate-source voltage Vgs of the transistor Q1 by the time constant thereof in order to return the overcurrent protection circuit 11 from a protection operation to a steady operation after the stop of the drive signal Sdrv. Note that the threshold voltage VTH is an example of a "pull-up voltage" of the present invention, and the resistor R11 is an example of a "ground circuit" of the present invention.

In this case, in a steady operation time interval, both the transistors Q1 and Q2 are turned off, and at this point, the detection voltage Vgs1 is held at a predetermined voltage. Next, when the gate-source voltage Vgs14 becomes the threshold voltage VTH due to the occurrence of the short circuit, the transistor Q2 is turned on, and further, when the gate-source voltage Vgs14 exceeds the threshold voltage VTH due to the continuation of the short circuit, the transistor Q1 is also turned on, and the protection operation starts. At this point, the voltage detector circuit 15 detects the detection voltage Vgs1, which is the gate-source voltage of the transistor Q1, and outputs a signal indicating the detection voltage Vgs1 to the controller unit 12. Next, when the protection operation starts and the detection voltage Vgs falls below the threshold voltage VTH, the transistor Q2 is turned off.

FIG. 3A is a timing chart illustrating operation waveforms of signals and the like in the current-driven switching circuit 10 in FIG. 1.

Referring to FIG. 3A, the current-driven switching circuit 10 starts operation at time t0, a short circuit occurs in the semiconductor switch 14 at time t1, and then, the controller unit 12 detects the short circuit at time t3. In this case, the time interval from the time t0 to the time t1 is referred to as a steady operation time interval, the time interval from the time t1 to time t2 is referred to as a protection operation time interval, the time interval from the time t2 to the time t3 is referred to as a protection holding time interval, the time interval from the time t3 to time t5 is referred to as a Vgs1-OFF time interval, and the process returns to the steady operation time interval from time t6.

In the steady operation time interval, because no current flows through the pull-up resistor R2 except for the time interval in which the detection voltage Vgs1 overshoots (to be described in detail later), the detection voltage Vgs1 is the threshold voltage VTH. Because the threshold voltage VTH is set higher than the gate-source voltage Vgs14 supplied by the drive unit 13 when the drive signal Sdry is at the high level, both the transistors Q1 and Q2 are always turned off during the steady operation time interval.

In general, when an overcurrent flows through a semiconductor device, a gate-source voltage of a semiconductor switch included in the semiconductor device overshoots (instantaneously rises). Also in the present embodiment, at the time t1 in FIG. 3A, the drain current Id flowing through the semiconductor switch 14 excessively increases, and the gate-source voltage Vgs14 of the semiconductor switch 14 rapidly increases and becomes a value higher than the threshold voltage VTH. As a result, the transistor Q2 is turned on, and thus the transistor Q1 is also turned on.

Therefore, the gate-source voltage Vgs14 is discharged by the transistor Q1 and becomes zero. As a result, because the semiconductor switch 14 is turned off, the overcurrent flowing through the semiconductor switch 14 can be stopped, and the overcurrent protection circuit 11 can start the protection operation. The time from the occurrence of the short circuit at the time t1 until the overcurrent protection circuit 11 starts the protection operation includes a delay in switching of the transistors Q1 and Q2, and is short, for example, about 20 to 100 nanoseconds.

In addition, the protection holding function according to the present embodiment is performed by the time constant circuit 19 connected to the gate terminal of the transistor Q1.

The voltage detector circuit 15 outputs to the controller unit 12 an abnormality detection signal Sa of the H level based on the detection voltage Vgs1. In response to this, the controller unit 12 determines that the protection operation has been performed and stops the output of the drive signal Sdry (time t3). In a stop time interval Ph, the drive signal Sdry is always at the low level, and the semiconductor switch 14 is always kept to be turned off.

Because the protection operation is held until the detection voltage Vgs1 is completely discharged by the time constant circuit 19, any repeated overcurrent does not occur.

When an abnormal state is eliminated in a protection state (time t4), after the stop of the drive signal, the time constant circuit 19 discharges the gate-source voltage Vgs of the transistor Q1 by the time constant thereof in order to return the overcurrent protection circuit 11 from the protection operation to the steady operation. As a result, the transistor Q1 is turned off (time t5) and the process returns to the steady operation.

FIG. 3B is a timing chart illustrating a simulation result of the current-driven switching circuit 10 in FIG. 1 and illustrating operation waveforms of the current and voltage thereof. As is clear from FIG. 3B, the gate-source voltage Vgs14 can be controlled without any large overshoot.

As described above, the overcurrent protection circuit 11 according to the present embodiment includes the pull-up resistor R2, the transistor Q1 which is an N-channel FET, the transistor Q2 which is a PNP bipolar transistor, the voltage detector circuit 15, and the time constant circuit 19 including the capacitor C11 and the resistor R11. When the gate-source voltage Vgs14 of the semiconductor switch 14 exceeds the threshold voltage VTH, the transistors Q2 and Q1 are sequentially turned on. As a result, the transistor Q1 instantaneously decreases the gate-source voltage Vgs14 to 0 V to start the protection operation of turning off the semiconductor switch. In addition, based on the abnormality detection signal Sa from the voltage detector circuit 15, the controller unit 12 stops the drive unit 13, and turns off the semiconductor switch 14. Therefore, according to the present embodiment, the overcurrent flowing through the semiconductor switch 14 can be stopped more quickly than the prior art, and the semiconductor switch 14 can be protected.

Figure 2B:
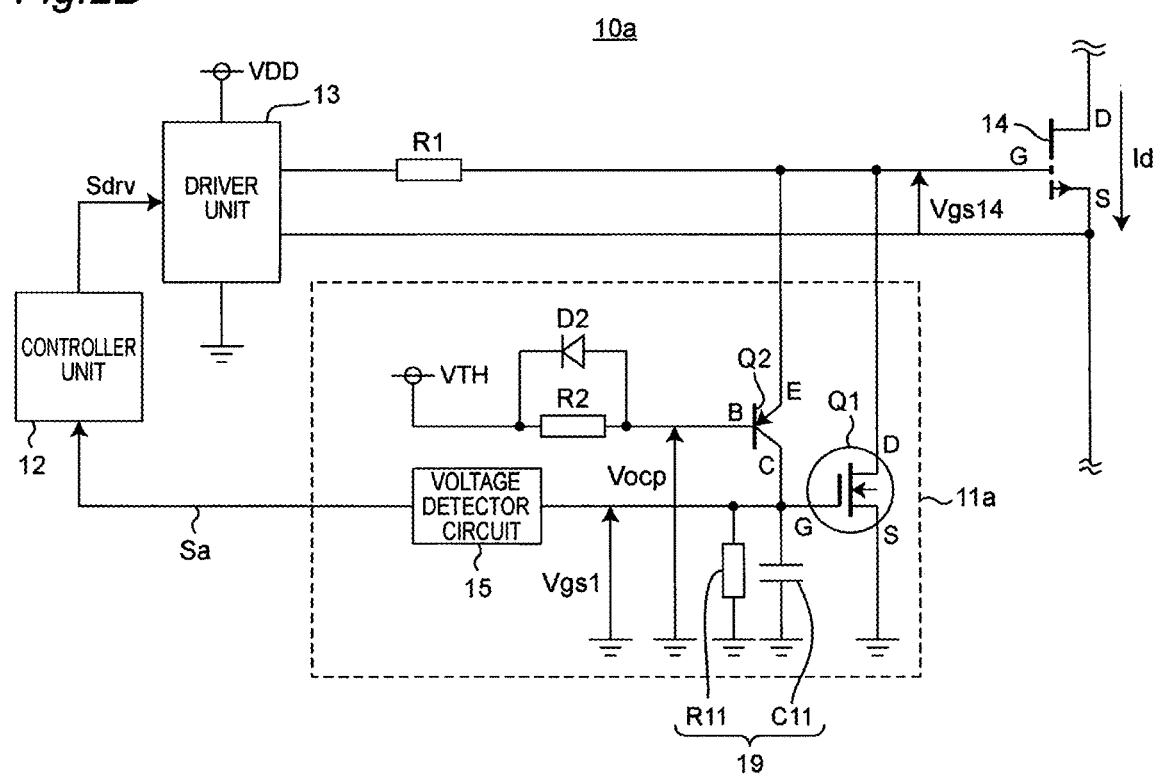
FIG. 2B is a block diagram illustrating a detailed configuration example of a current-driven switching circuit 10a according to a modified embodiment of the first embodiment.

FIG. 2B is a block diagram illustrating a detailed configuration example of a current-driven switching circuit 10a according to a modified embodiment of the first embodiment. The current-driven switching circuit 10a in FIG. 2B includes an overcurrent protection circuit 11a instead of the overcurrent protection circuit 11 in FIG. 2A, and is different in that a noise removal diode D2 is provided in the resistor R2. It is noted that this modified embodiment can also be applied to embodiments other than the first embodiment.

Second Embodiment

In the first embodiment, when the gate-source voltage Vgs14 of the semiconductor switch 14 rises, a threshold voltage Vocp temporarily rises as illustrated in FIG. 3B. At this time, a delay occurs due to fluctuation of the threshold voltage Vocp, which causes a delay in the start of the protection operation.

Figure 4:
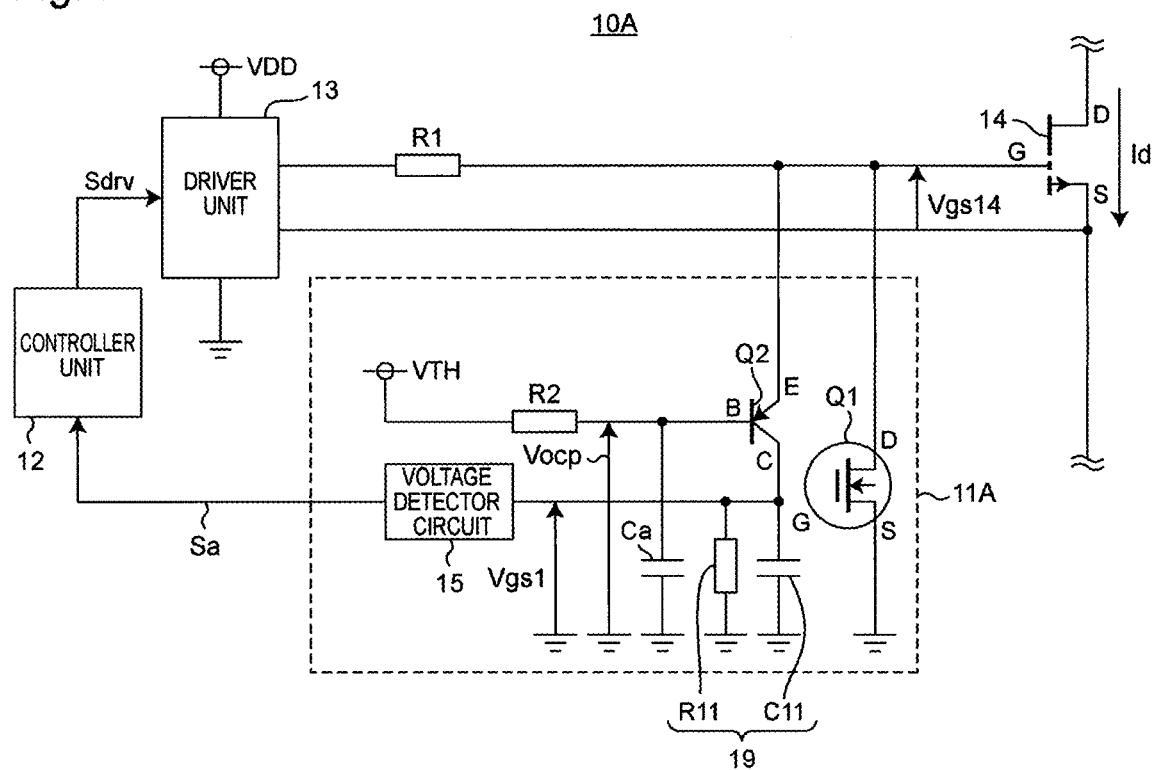
FIG. 4 is a block diagram illustrating a configuration example of a current-driven switching circuit 10A according to a second embodiment.

FIG. 4 is a block diagram illustrating a configuration example of a current-driven switching circuit 10A according to a second embodiment. Referring to FIG. 4, the current-driven switching circuit 10A is different from the current-driven switching circuit 10 in the following points.

(1) An overcurrent protection circuit 11A further includes a capacitor Ca connected to the base of a transistor Q2.

(2) The power supply having the threshold voltage VTH charges the capacitor Ca to the threshold voltage VTH via a pull-up resistor R2.

In the second embodiment, the short circuit occurs in the semiconductor switch 14, and the gate-source voltage Vgs14 rapidly rises. At this time, the threshold voltage Vocp temporarily increases as the gate-source voltage Vgs14 rises, but this change is reduced by the capacitor Ca. Therefore, the delay in the start of the protection operation can be suppressed.

Figure 5:
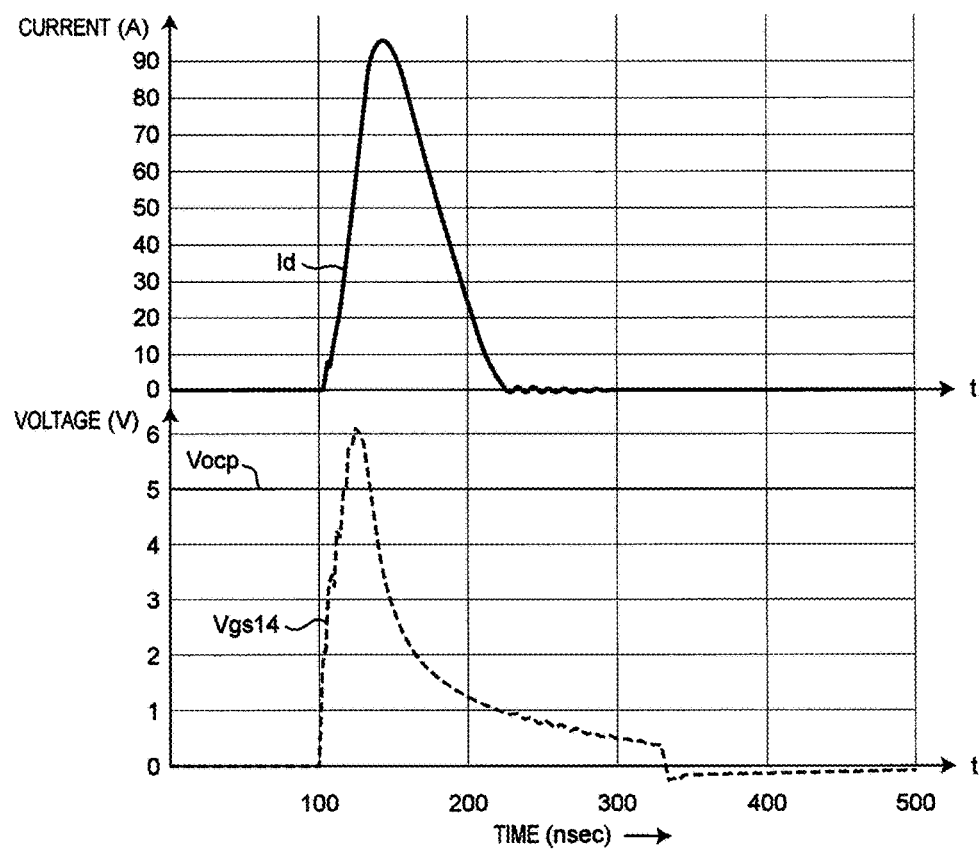
FIG. 5 is a timing chart illustrating a simulation result of the current-driven switching circuit 10A in FIG. 4 and illustrating operation waveforms of the current and voltage thereof.

FIG. 5 is a timing chart illustrating a simulation result of the current-driven switching circuit 10A in FIG. 4 and illustrating operation waveforms of the current and voltage thereof. As is apparent from FIG. 5, the threshold voltage Vocp can be controlled without a large temporary rise.

As described above, the overcurrent protection circuit 11A according to the present embodiment further includes the capacitor Ca in addition to the overcurrent protection circuit 11. As a result, the temporary rise of the threshold voltage Vocp due to the rise of the gate-source voltage Vgs14 can be made smaller than that of the overcurrent protection circuit 11 in FIG. 2A, and the delay at the start of the protection operation can be reduced as compared with the overcurrent protection circuit 11.

Third Embodiment

Figure 6:
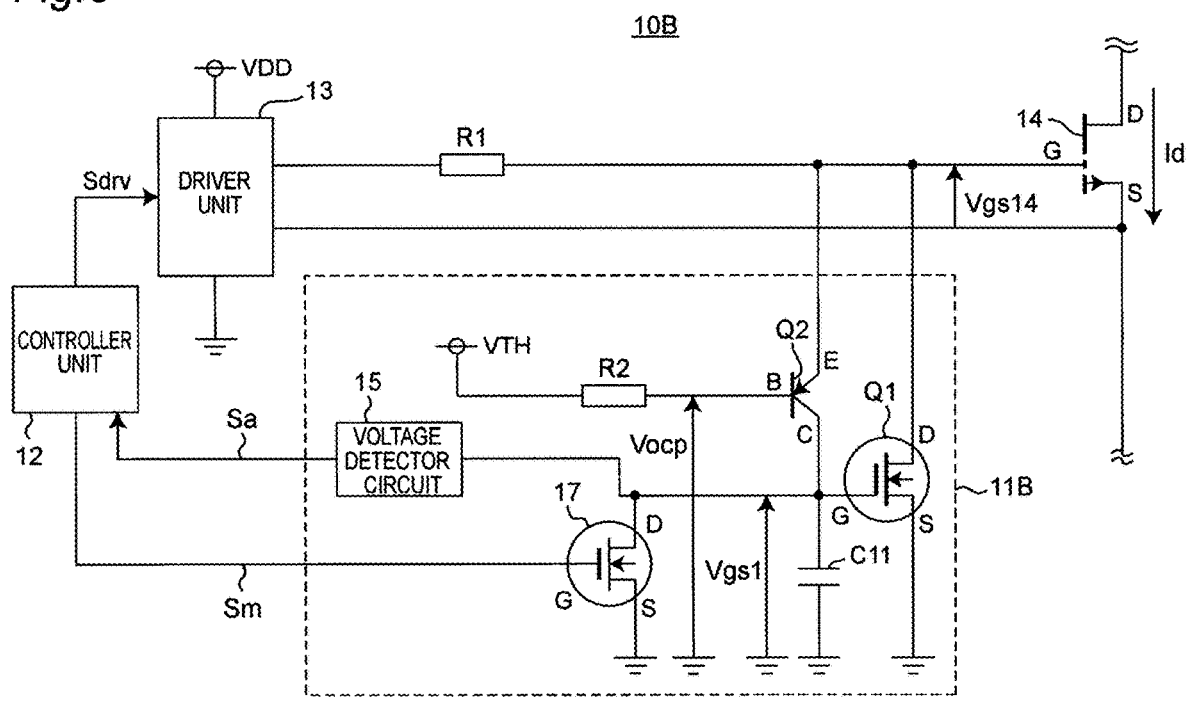
FIG. 6 is a block diagram illustrating a configuration example of a current-driven switching circuit 10B according to a third embodiment.

FIG. 6 is a block diagram illustrating a configuration example of a current-driven switching circuit 10B according to a third embodiment.

Referring to FIG. 6, the current-driven switching circuit 10B is different from the current-driven switching circuit 10A in FIG. 4 in the following point.

(1) The current-driven switching circuit 10B includes, instead of the resistor R11, a transistor 17 that is, for example, an N-channel MOSFET and operates as a ground circuit.

Referring to FIG. 6, a return signal Sm from the controller unit 12 is inputted to the gate of the transistor 17, the drain of the transistor 17 is connected to the gate of the transistor Q1, and the source of the transistor 17 is grounded. After the stop of a drive signal, the controller unit 12 outputs the return signal Sm to the gate of the transistor 17 in order to return the overcurrent protection circuit 11B from the protection operation to the steady operation. Accordingly, the gate-source voltage Vgs1 of the transistor Q1 is discharged by turning on the transistor 17.

Figure 7:
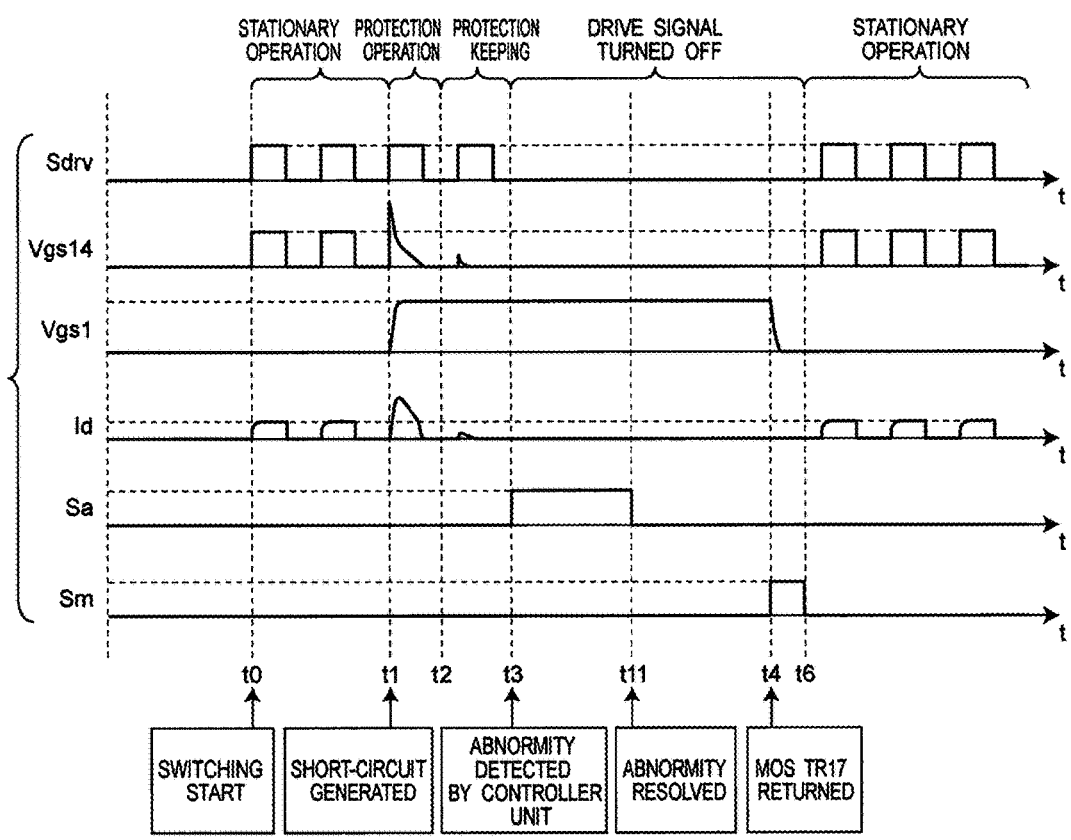
FIG. 7 is a timing chart illustrating operation waveforms of signals and the like in the current-driven switching circuit 10B in FIG. 6.

FIG. 7 is a timing chart illustrating operation waveforms of signals and the like in the current-driven switching circuit 10B in FIG. 6.

Referring to FIG. 7, the current-driven switching circuit 10B is different from the current-driven switching circuit 10A in FIG. 4 in the following points.

(1) When the short circuit occurs at time t1, the gate voltage of the transistor Q1 rises, and the protection operation starts.

(2) At time t3, the controller unit 12 detects an abnormal state from a voltage detector circuit 15 based on an abnormality detection signal Sa, and then, determines that the abnormal state has been eliminated when the abnormality detection signal Sa decreases to the low level (at time t11), and then, outputs the return signal Sm to the gate of the transistor 17 after a predetermined time interval (time t4). As a result, the transistor 17 is turned on, and the gate-source voltage Vgs of the transistor Q1 is discharged to cause the transistor Q1 to be turned off, and the semiconductor switch 14 returns from the protection state to the steady state (at time T6).

As described above, the current-driven switching circuit 10B according to the third embodiment includes the transistor 17. After determining that the abnormal state has been eliminated (time t11) and after a predetermined time time interval (time t4), the controller unit 12 outputs the return signal Sm to the gate of the transistor 17. As a result, the transistor 17 is turned on, and the gate-source voltage Vgs of the transistor Q1 is discharged to cause the transistor Q1 to be turned off, and the semiconductor switch 14 returns from the protection state to the steady state (at time T6).

Fourth Embodiment

Figure 8:
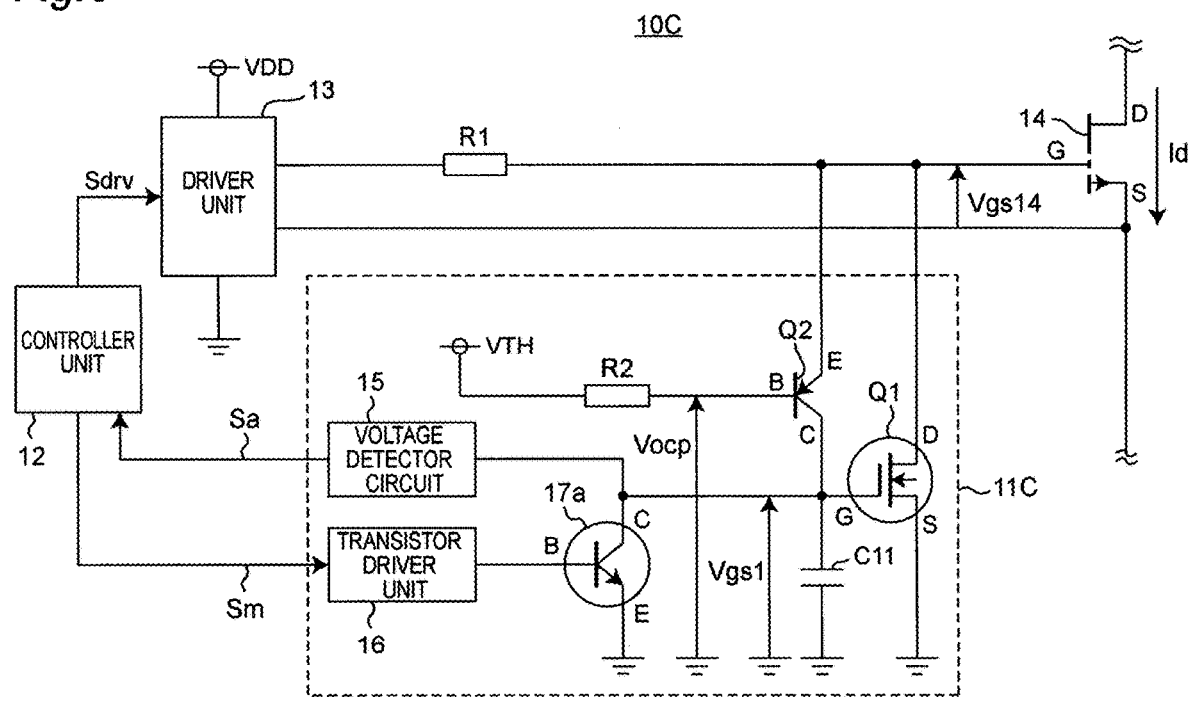
FIG. 8 is a block diagram illustrating a configuration example of a current-driven switching circuit 10C according to a fourth embodiment.

FIG. 8 is a block diagram illustrating a configuration example of a current-driven switching circuit 10C according to a fourth embodiment. Referring to FIG. 8, the current-driven switching circuit 10C is different from the current-driven switching circuit 10B in FIG. 6 in the following points.

(1) Instead of the transistor 17 which is an N-channel MOSFET, for example, a transistor 17a which is an NPN bipolar transistor is provided.

(2) A transistor drive unit 16 is provided between a controller unit 12 and the gate of the transistor 17a.

Referring to FIG. 8, the controller unit 12 controls a base current Itr of the transistor 17a via the transistor drive unit 16 to control the transistor 17a to be turned on and off. As a result, the same effects as those of the third embodiment can be obtained.

Modified Embodiments

Although the embodiments of the present invention have been described in details above, the above description is merely an example of the present invention in all respects. It goes without saying that various improvements and modifications can be made without departing from the scope of the present invention. For example, the following modifications are possible. In the following description, the same reference characters are used for the same components as those of the above embodiments, and the description of the same points as those of the above embodiments is appropriately omitted. The following modified embodiments can be appropriately combined.

In the first to fourth embodiments, the boost chopper circuit 1 has been described as a semiconductor device including the current-driven switching circuits 10 and 10A to 10C according to the present invention. However, the present invention is not limited thereto, and can be used for a circuit, an apparatus, and the like that perform switching control of a current with a semiconductor switch.

Figure 9:
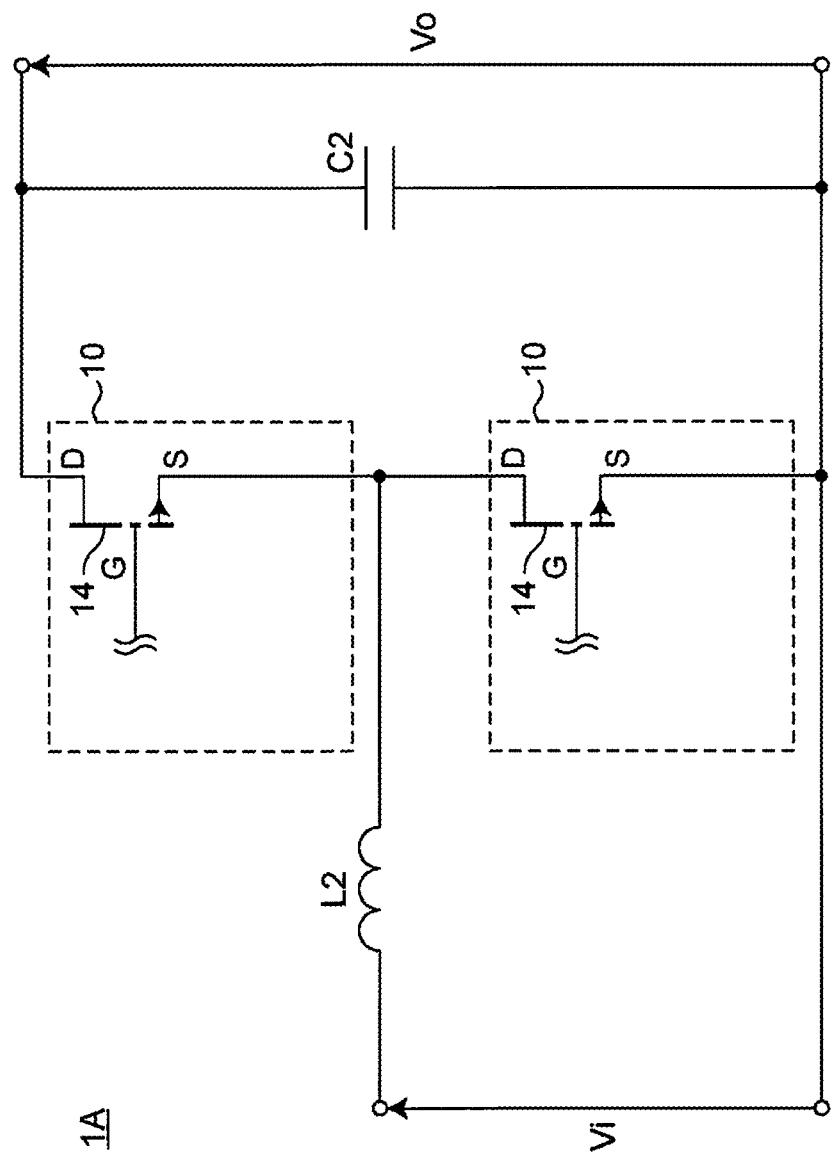
FIG. 9 is a block diagram illustrating a configuration example of a half-bridge inverter circuit 1A according to a first modified embodiment.

For example, FIG. 9 is a block diagram illustrating a configuration example of a half-bridge inverter circuit 1A according to a first modified embodiment. Referring to FIG. 9, the half-bridge inverter circuit 1A includes an inductor L2, the two current-driven switching circuits 10, and a capacitor C2.

Referring to FIG. 9, the semiconductor switches 14 of the two current-driven switching circuits 10 are controlled to be turned on time intervalically and alternately. As a result, an input voltage Vi is switched, smoothed by the capacitor C2, and converted into an alternating current (AC) output voltage Vo. As a result, the half-bridge inverter circuit 1A switches a DC input voltage Vi, converts the DC input voltage Vi into the AC output voltage Vo, and outputs the AC output voltage Vo. Each of the two current-driven switching circuits 10 may be replaced with any one of the current-driven switching circuits 10A to 10C.

Figure 10:
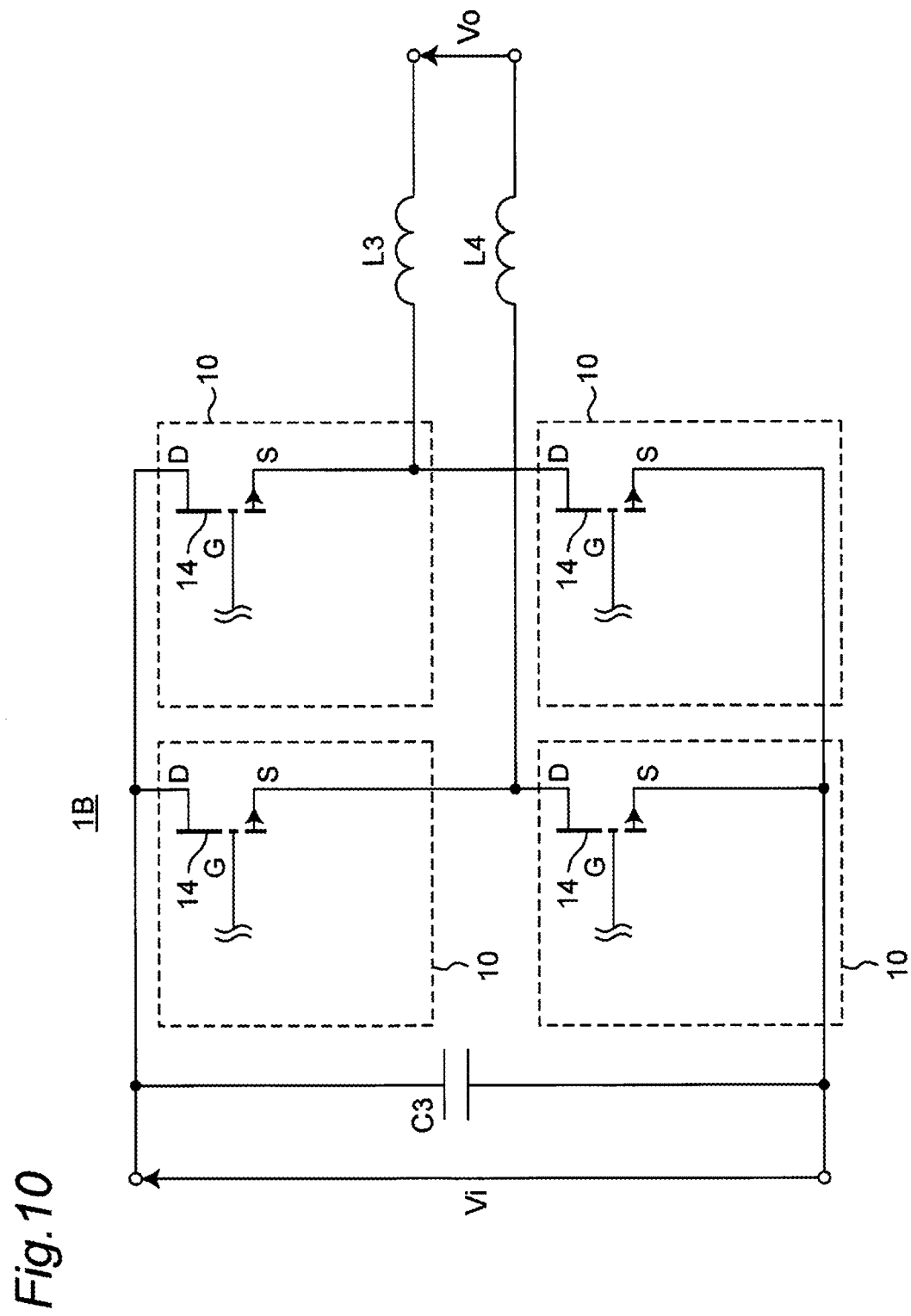
FIG. 10 is a block diagram illustrating a configuration example of a full-bridge inverter circuit 1B according to a second modified embodiment.

In addition, FIG. 10 is a block diagram illustrating a configuration example of a full-bridge inverter circuit 1B according to a second modified embodiment. Referring to FIG. 10, the full-bridge inverter circuit 1B includes a capacitor C3, four current-driven switching circuits 10, and inductors L3 and L4.

Referring to FIG. 10, the four current-driven switching circuits 10 are controlled such that a time interval in which the first and fourth current-driven switching circuits 10 (upper left and lower right in the drawing) are turned on and the second and third current-driven switching circuits 10 (lower left and upper right in the drawing) are turned off and a time interval in which these on and off of the current-driven switching circuits are reversed time intervalically and alternately appear. As a result, an input voltage Vi is switched, and the switched input voltage Vi is smoothed by the capacitor C3 and the inductors L3 and L4. As a result, the full-bridge inverter circuit 1B switches the DC input voltage Vi, converts the DC input voltage Vi into an AC output voltage Vo, and outputs the AC output voltage Vo. Each of the four current-driven switching circuits 10 may be replaced with any one of the current-driven switching circuits 10A to 10C.

As described above, the current-driven switching circuit and the overcurrent protection circuit according to the present invention can be used for a circuit and an apparatus that perform switching control of a current in a semiconductor device.

In addition, in the first to fourth embodiments, the pull-up resistor R2 is used as means for limiting the current from the power supply of the threshold voltage VTH. However, the present invention is not limited thereto, and a diode or the like may be used instead of the pull-up resistor R2. Further, in the first to fourth embodiments, the current-driven switching circuits 10 and 10A to 10C are used as the switching circuits. However, the present invention is not limited thereto, and a voltage-driven switching circuit may be used instead of the current-driven switching circuit.

The invention claimed is:

1. An overcurrent protection circuit for protecting an overcurrent flowing through a switching element that is controlled to be turned on and off based on a drive signal, the overcurrent protection circuit comprising:
   a first transistor that is an N-channel field effect transistor (FET) having a drain connected to a control terminal of the switching element and a grounded source;
   a second transistor that is a PNP bipolar transistor having an emitter connected to the control terminal of the switching element, a collector connected to a gate of the first transistor and grounded via a first capacitor, and a base pulled up to a predetermined pull-up voltage; and
   a ground circuit connected in parallel with the first capacitor,
   wherein the ground circuit is connected between the collector of the second transistor and a ground.

2. The overcurrent protection circuit as claimed in claim 1,
   wherein the ground circuit is a first resistor, and
   wherein the first capacitor and the first resistor configures a first time constant circuit.

3. The overcurrent protection circuit as claimed in claim 1,
   wherein the ground circuit is a third transistor that is an FET including a drain and a source connected in parallel with the first capacitor, and a gate applied with a return signal for returning the overcurrent protection circuit from a protection operation to a steady operation.

4. The overcurrent protection circuit as claimed in claim 3, further comprising:
   a controller unit configured to generate the drive signal; and
   a voltage detector circuit that generates an abnormality detection signal for turning off the switching element based on a voltage of the gate of the first transistor and outputs the abnormality detection signal to the controller unit.

5. The overcurrent protection circuit as claimed in claim 4,
   wherein the controller unit is configured to generate the return signal and applies the return signal to the gate of the third transistor after a predetermined time from when the abnormality detection signal disappears.

6. The overcurrent protection circuit as claimed in claim 1,
   wherein the ground circuit is a fourth transistor that is a bipolar transistor including a collector and an emitter connected in parallel with the first capacitor, and a base applied with a return signal for returning the overcurrent protection circuit from a protection operation to a steady operation.

7. The overcurrent protection circuit as claimed in claim 6, further comprising:
   a controller unit configured to generate the drive signal; and
   a voltage detector circuit that generates an abnormality detection signal for turning off the switching element based on a voltage of the gate of the first transistor and outputs the abnormality detection signal to the controller unit.

8. The overcurrent protection circuit as claimed in claim 7,
   wherein the controller unit is configured to generate the return signal and applies the return signal to the gate of the third transistor after a predetermined time from when the abnormality detection signal disappears.

9. The overcurrent protection circuit as claimed in claim 1 further comprising:
   a second resistor connected between the base of the second transistor and the pull-up voltage;
   and a first diode connected in parallel with the second resistor.

10. The overcurrent protection circuit as claimed in claim 1,
    further comprising a second capacitor connected to the base of the second transistor and a ground.

11. The overcurrent protection circuit as claimed in claim 1, further comprising a second time constant circuit including a third resistor connected between the base of the second transistor and the pull-up voltage, and a third capacitor connected between a connection point of the third resistor and the pull-up voltage and the ground.

12. The overcurrent protection circuit as claimed in claim 11, further comprising a third diode connected in parallel with the third resistor.

13. A switching circuit comprising:
    an overcurrent protection circuit, and
    a switching element,
    wherein the overcurrent protection circuit is configured to protect an overcurrent flowing through the switching element that is controlled to be turned on and off based on a drive signal,
    wherein the overcurrent protection circuit comprises:
    a first transistor that is an N-channel field effect transistor (FET) having a drain connected to a control terminal of the switching element and a grounded source;
    a second transistor that is a PNP bipolar transistor having an emitter connected to the control terminal of the switching element, a collector connected to a gate of the first transistor and grounded via a first capacitor, and a base pulled up to a predetermined pull-up voltage; and
    a ground circuit connected in parallel with the first capacitor
    wherein the ground circuit is connected between the collector of the second transistor and a ground.

* * * * *